US010955463B2

(12) United States Patent
Bunting et al.

(10) Patent No.: US 10,955,463 B2
(45) Date of Patent: *Mar. 23, 2021

(54) MEASURING DEVICE WITH FUNCTIONAL UNITS CONTROLLABLE VIA A BLOCK DIAGRAM

(71) Applicant: Rohde & Schwarz GmbH & Co. KG, Munich (DE)

(72) Inventors: Carsten Bunting, Munich (DE); Waldemar Mertke, Landshut (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 1537 days.

This patent is subject to a terminal disclaimer.

(21) Appl. No.: 14/341,548

(22) Filed: Jul. 25, 2014

(65) Prior Publication Data
US 2015/0309110 A1 Oct. 29, 2015

Related U.S. Application Data (60) Provisional application No. 61/984,177, filed on Apr. 25, 2014.

(51) Int. Cl.
| | |
|---|---|
| *G01R 31/28* | (2006.01) |
| *H04B 17/309* | (2015.01) |
| *G06F 3/048* | (2013.01) |
| *G09G 5/00* | (2006.01) |
| *H04B 17/00* | (2015.01) |
| *H04B 17/23* | (2015.01) |

(52) U.S. Cl.
CPC ......... *G01R 31/2841* (2013.01); *G06F 3/048* (2013.01); *G09G 5/003* (2013.01); *H04B 17/00* (2013.01); *H04B 17/309* (2015.01); *H04B 17/23* (2015.01)

(58) Field of Classification Search
CPC .................................................. G01R 31/2841
USPC ......................................................... 702/127
See application file for complete search history.

(56) References Cited

U.S. PATENT DOCUMENTS

| | | | | |
|---|---|---|---|---|
| 4,570,217 A | * | 2/1986 | Allen ........................ | G06F 1/14 700/83 |
| 5,696,885 A | * | 12/1997 | Hekmatpour ......... | G06F 3/0481 706/12 |

(Continued)

*Primary Examiner* — Alexander Satanovsky
*Assistant Examiner* — Douglas Kay
(74) *Attorney, Agent, or Firm* — Potomac Technology Law, LLC (57) ABSTRACT

A measuring device comprises several functional units which may be connected to each other in various combinations, a control device which determines the connection and functions of the functional unites, and optical display device. The functional units are symbolized by function blocks which may be represented on the display device and graphically connected by connection elements. The control device controls the display device so that the functional blocks are graphically connected to each other correspondingly to the actual connection of the functional units by the connection elements. Specific configuration settings and/or specific functions of a functional unit are directly selectable and/or configurable on the visual display device through shortening links of the configuration setting. Alternatively panel images of the measuring device are displayed on the displaying device and wherein the visual display device indicates a selected connector.

14 Claims, 7 Drawing Sheets

(56) References Cited

U.S. PATENT DOCUMENTS

| | | | | |
|---|---|---|---|---|
| 6,874,122 B1* | 3/2005 | Bates | G06F 17/2247 | 715/236 |
| 7,107,221 B1* | 9/2006 | Tracy | G06Q 20/20 | 705/26.81 |
| 7,162,387 B2* | 1/2007 | Johnson | H04L 43/50 | 702/119 |
| 7,257,509 B2* | 8/2007 | Pauly | G01R 31/2846 | 340/500 |
| 9,021,361 B1* | 4/2015 | Pettinati | G06Q 30/00 | 715/736 |
| 9,047,259 B1* | 6/2015 | Ho | G06F 17/30882 | |
| 9,460,239 B1* | 10/2016 | Yunt | G06F 8/10 | |
| 2003/0188047 A1* | 10/2003 | Christensen | G05B 19/054 | 710/5 |
| 2003/0233049 A1* | 12/2003 | Lampotang | G09B 23/12 | 600/500 |
| 2004/0207637 A1* | 10/2004 | Pauly | G01R 31/2846 | 345/619 |
| 2006/0059462 A1* | 3/2006 | Yamamoto | G06F 17/2247 | 717/115 |
| 2007/0044078 A1* | 2/2007 | Cifra | G01R 31/318357 | 717/135 |
| 2008/0034079 A1* | 2/2008 | Kodosky | G06F 8/34 | 709/223 |
| 2008/0034298 A1* | 2/2008 | Kodosky | G06F 3/0484 | 715/763 |
| 2008/0034310 A1* | 2/2008 | Kodosky | G05B 19/0426 | 715/769 |
| 2008/0147371 A1* | 6/2008 | Gupton | G06F 17/5009 | 703/14 |
| 2010/0179674 A1* | 7/2010 | Willard | G10H 1/0025 | 700/94 |
| 2011/0282943 A1* | 11/2011 | Anderson | G06Q 10/06 | 709/204 |
| 2012/0036472 A1* | 2/2012 | Huang | G06F 3/04892 | 715/781 |
| 2013/0145296 A1* | 6/2013 | Stecher | G06F 3/0482 | 715/765 |
| 2013/0275891 A1* | 10/2013 | Holiday | G06F 3/048 | 715/762 |
| 2013/0291079 A1* | 10/2013 | Lowe | G06F 21/00 | 726/7 |
| 2014/0089243 A1* | 3/2014 | Oppenheimer | G06F 21/50 | 706/46 |
| 2015/0248378 A1* | 9/2015 | Nordback | G06F 17/212 | 715/243 |

\* cited by examiner

MEASURING DEVICE WITH FUNCTIONAL UNITS CONTROLLABLE VIA A BLOCK DIAGRAM

RELATED APPLICATIONS

This application claims the benefit of the earlier filing date under 35 U.S.C. § 119(e) of U.S. Provisional Application Ser. No. 61/984,177 (filed 2015 Apr. 25).

TECHNICAL FIELD

The invention relates to a measuring device, especially, a signal generator, with several functional units, for example, with a base band unit, a fading unit, a noise unit, an I/Q-modulator and a high-frequency unit. The configuration of the functional units is variable within certain limits, and the function of functional units can be selected by the user from a predetermined range of functions.

The functions of measuring devices of this kind have conventionally been selected via operating keys (soft keys and hard keys) of the measuring device. However, with this method of operation, the sequence in the signal flow according to which the individual functional units are connected to one another and influence the signal to be generated is not clearly evident. The currently active output connectors and the signals connected to them cannot be identified.

BACKGROUND

Regarding the technical background, reference is made to U.S. Patent Publication No. 2004/0207637 A1. This document describes a measuring device comprising a plurality of functional units capable of being selectively connected to one another. A control device is configured for setting a configuration and functions of the functional units. A visual display device is configured for a plurality of functional blocks to be displayed on the display device and graphically connected by means of connecting elements, wherein the control unit is further configured for controlling the display device so that the functional blocks are graphically interconnected by the connecting elements in a manner that corresponds to the current configuration of the functional units.

Consequently there is a need of providing a measuring device with variably configurable functional units, of which the functions are variable, wherein a selection of a specific configuration of the functional units and/or selection of a specific function of the functional units is realized in a user-friendly manner. Especially the time-consuming selection of configurations and/or settings within submenus of the configuration menu is to be avoided.

SOME EXAMPLE EMBODIMENTS

Embodiments of the present invention advantageously address the foregoing requirements and needs, as well as others, by providing a measuring device which guides the user in selecting, configuring and/or using the correct connector at a panel of the measuring device, which avoids confusion in case of highly configurable connectors and in case of a high number of connectors of a measuring device. Embodiments of the invention are based on the general concept of providing a graphic display of functional blocks which symbolize the functional units on a display device (display) also including their connections, wherein the functional blocks on the display device are graphically interconnected in a manner which corresponds with the current configuration of the functional units. Specific configuration settings and/or specific functions of each functional unit are directly selectable and/or configurable on the visual display device through shortening links of the configuration setting to avoid time-consuming selections of this specific function and/or configuration due to selection of a variety of submenus. Further embodiments of the invention may be based on the general concept of displaying panel images of the measuring device on the displaying device, wherein the visual display device indicates a selected connector, which provides an easy user-friendly selection of connectors.

BRIEF DESCRIPTION OF THE DRAWINGS

These and other features, aspects and advantages of the present invention will become better understood with regard to the following description, appended claims and accompanying drawings where:

DETAILED DESCRIPTION

Figure 1:
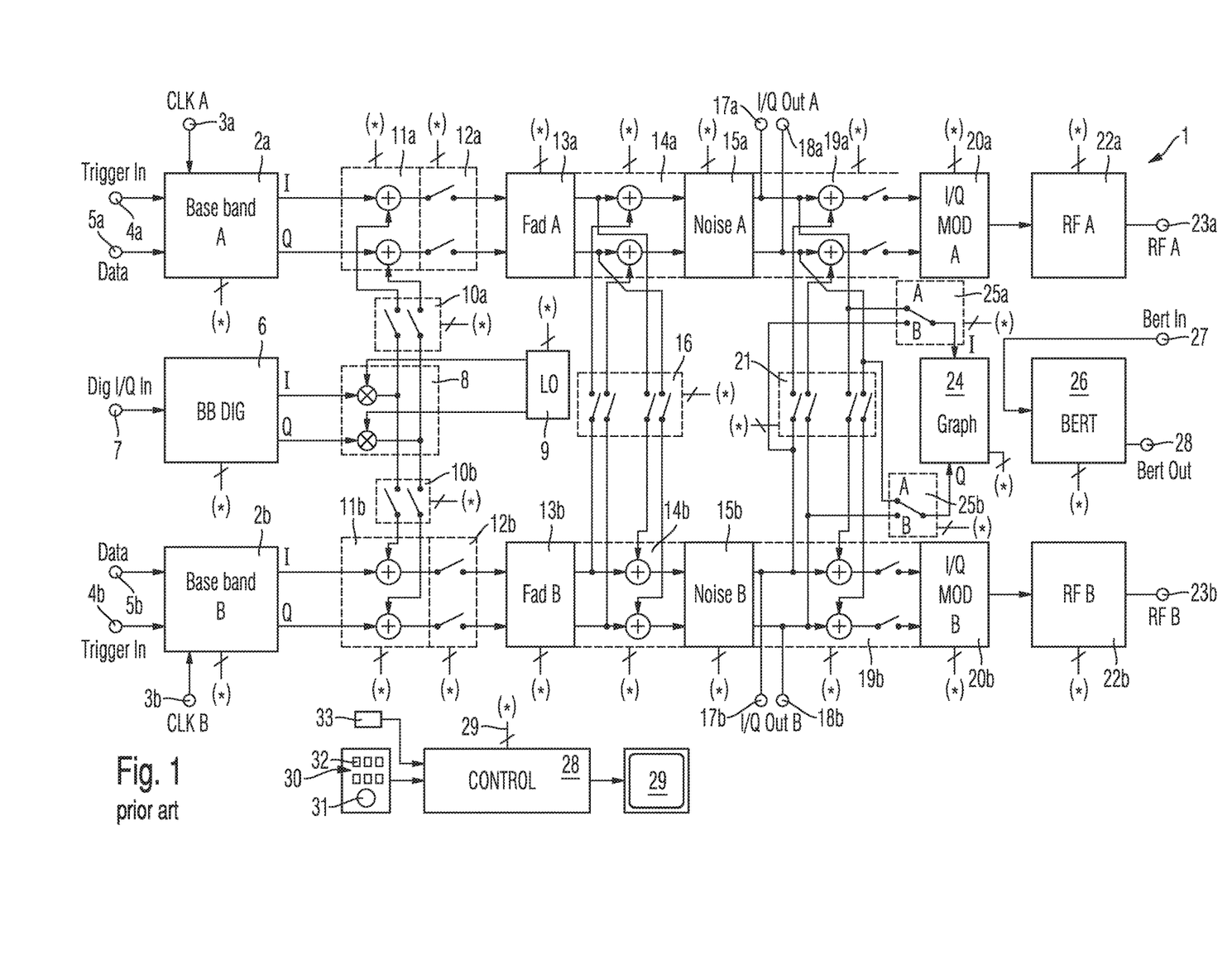
FIG. 1 shows a block circuit diagram of a signal generator designed as a measuring device, according to example embodiments of the present invention.

Before describing the various examples of the graphic display of functional blocks in detail with reference to FIGS. 2 to 7, an exemplary block circuit diagram for a signal generator, which is designed as a measuring device according to example embodiments of the invention, will first be described with reference to FIG. 1.

The signal generator 1 comprises a first base band unit 2a and a second base band unit 2b. The base band units 2a and 2b generate base band signals at their I and Q outputs according to predefined standards which can be selected by the user, for example, according to the GSM® standard, the GSM®-EDGE standard, the Wideband-CDMA standard, the UMTS standard or the LTE standard. The base band units 2a, 2b are supplied with clock signals at connectors 3a, 3b, trigger signals at connectors 4a and/or 4b and modulation data at connectors 5a and/or 5b.

In the exemplary embodiment illustrated, a digital base band generator unit 6 is provided alongside these units, which generates the I and Q components of a further base band signal from digital I/Q-values supplied to connector 7. The output signal from the digital base band generator 6 can be multiplied in a multiplication unit 8, to which the constant frequency from an adjustable local oscillator 9 is supplied.

The optionally multiplied base band signal from the digital base band generating unit 6 can be supplied via a switching element 10a and/or a second switching element 10b, to the digital addition unit 11a or digital addition unit 11b.

The output signal from the base band units 2a and 2b and/or from the addition units 11a and 11b is supplied, via a switching element 12a and/or a switching element 12b, to a fading unit 13a and/or 13b, which applies fading (variable decrease) to the base and signal. The functions of the fading units 13a and 13b, such as the number, the time delay and the attenuation of the signal delay paths implemented in the fading unit can be specified by the user. The fading units 13a and 13b are connected via an addition unit 14a and/or 14b in each case to a noise unit 15a and/or 15b. The noise units 15a, 15b apply a noise signal, which can be specified by the user, to the base band signal, wherein, for example, the type and level of the noise signal generated by the noise unit 15a, 15b can be selected by the user.

Instead of providing a separate connection of the relevant fading units 13a and/or 13b to the allocated noise unit 15a and/or 15b, the output signals from the fading units 13a, 13b can be added by means of a switching element 16 which connects the addition units 14a and 14b, and supplied in each case, to one of the two noise units 15a and/or 15b. The I/Q-output signals at the output of the noise units 15a and/or 15b can be tapped at connectors 17a and 18a or 17b and 18b.

The output signals from the noise units 17a and 17b can be supplied to I/Q-modulators 20a and/or 20b via addition units and switching units 19a and 19b. In this context, the output signals from the noise units 15a and 15b can be added via a switching element 21 and supplied to one of the two I/Q-modulators 20a and/or 20b. With reference to the function of the I/Q-modulators 20a and/or 20b, several user-specific selection options are also available. For example, the I/Q-modulator 20a, 20b can be operated in such a manner that it generates a burst-sequence, wherein the active bursts and/or the level of the active bursts can be selected by the user.

The I/Q-modulators 20a and 20b are each connected to a high-frequency unit 22a and/or 22b, and a high-frequency signal can be picked up at a connector 23a and/or 23b. For example, the output frequency or several output frequencies initiated according to the sudden frequency change procedure of the high frequency unit 22a and 22b can be selected by the user.

Additionally, a signal display 24 is provided, which, in the exemplary embodiment, can be connected via switching elements 25a and/or 25b to the output of the noise unit 15a or the noise unit 15b. Alternatively, it is also conceivable for the display device 24 to be connected directly to the outputs of the base band units 2a and 2b. For example, the signal display 24 allows a display of the configuration diagram, so that the user can monitor the method of Operation of the connected signal paths.

Furthermore, a Bit Error Rate Tester (BERT) 26 is provided in such a manner that a signal from the device under test (DUT) can be supplied to the output connector 27 of the Bit Error Rate Tester allowing the bit error rate of the signal to be picked up at the output connector 28. The BERT 26 is further configurable by the user.

Further functional units and variant combinations of the functional units may also be provided. These have not been explained in greater detail for the sake of simplicity.

All of the functional units described above: 2a, 2b, 6, 8, 9, 10a, 10b, 11a, 11b, 12a, 12b, 13a, 13b, 14a, 14b, 15a, 15b, 16, 19a, 19b, 20a, 20b, 21, 22a, 22b, 24 and 26 are connected via a control bus to a control device 28 such as a CPU. The connection of the control bus to the functional units is indicated with the symbol (*). The control unit 28 controls the configuration and function of the individual functional units as required by the user. The current configuration of the functional units is displayed on the display device 29, which, together with the operating elements 30 may be disposed on the front of the signal generator 1. For this purpose, a graphic functional block is allocated to each functional unit, and the interconnection of the functional units is displayed on the display device 29 by corresponding connecting elements, which interconnect the functional blocks. The connections between the functional blocks and the functions of the functional blocks are selected either by touching the display 29, in case a touch display 29 is used and/or with a rotary knob 31 and/or corresponding operating buttons 32 and/or via a mobile positioning element 33, such as a mouse.

Several examples of the display 29 of the functional blocks allocated to each of the functional units and the associated selection of functions for the relevant functional units will be explained below with reference to FIGS. 2 to 7.

Figure 2:
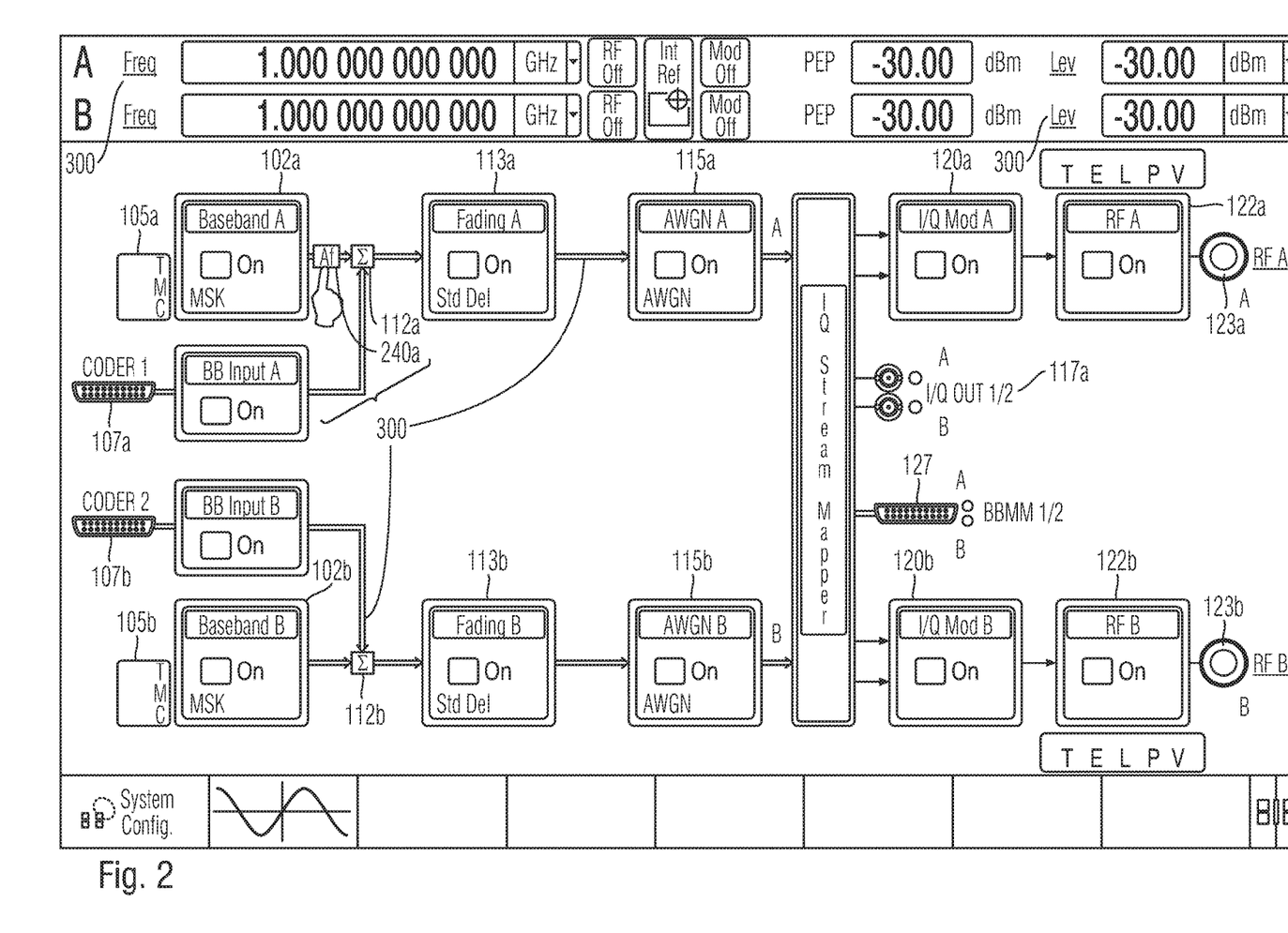
FIG. 2 shows a first example of a graphic display symbolizing the shortening links, according to example embodiments of the present invention.

FIG. 2 shows the display surface of the display device 29 in an initial functional example, symbolizing the shortening links, according to example embodiments of the present invention. It can be seen that the functional blocks presented on the display 29 correspond to the functional units described with reference FIG. 1. The reference numbers for the functional blocks are greater, in each case by the value 100, than the reference numbers for the functional units presented in FIG. 1.

In FIG. 2, a first base band block 102a corresponding to the first base band unit 2a, a first fading block 113a corresponding to the first fading unit 13a and a first noise block 115a corresponding to the first noise unit 15a, a first I/Q-modulator block 120a corresponding to the first I/Q-modulator 20a and a first high frequency block 122a corresponding to the first high-frequency block 22a, are displayed as functional blocks. In this context, the signal inputs and outputs and the data inputs and outputs 105a, 107a, 117a, 123a and 127 correspond to the connectors 5a, 7a, 17a, 23a and 27 as shown in FIG. 1.

Furthermore, in FIG. 2, a second base band block 102b corresponding to the second base band unit 2b, a second fading block 113b corresponding to the second fading unit 13b and a second noise block 115b corresponding to the second noise unit 15b, a second I/Q-modulator block 120b corresponding to the second I/Q-modulator 20b and a second high frequency block 122b corresponding to the second high-frequency block 22b, are displayed as functional blocks. In this context, the signal inputs and outputs and the data inputs and outputs 105b, 107b and 123b correspond to the connectors 5b, 7b and 23b as shown in FIG. 1.

By observing the display device 29, the user can recognize at a glance, on the basis of the functional blocks displayed, which functional units have been selected and connected for the current functions of the signal generator 1. Furthermore, the user can immediately recognize which inputs and outputs are provided with signals and in which manner. The internal signal flow and therefore also the signal conditioning are presented to the user in a very transparent manner. For example, the user can immediately see that the fading unit 13a is arranged in front of the noise unit 15a, whether the bursting of the signal is implemented in the base band or in the high-frequency band, and to which connectors external signals can be applied and how these will influence the signal flow. In particular, the user can immediately identify whether a connector is acting as an input or as an output.

By observing the display device 29, the user can immediately recognize the current configuration of the signal generator 1, namely that the two base band units 2a, 2b, fading units 13a, 13b, noise units 15a, 15b and I/Q-modulators 20a, 20b are coupled to one another. The digital base band generator 6 is added with a frequency offset to the base band signal generated by the first base band unit 2a.

Since the functional blocks of the measuring device 1 are highly complex and comprise a majority of adjustable parameters, settings and configurations, it is sometimes user-inconvenient to find the appropriate submenu in which the needed configuration and/or setting is selectable.

The display device 29 may comprise a touch display, so that the functions of the functional blocks can directly be selected and settings/configurations of the functional block can be chosen, input and/or read out by touching the display 29 at the appropriate position.

Alternatively or additionally the functions of one of the functional units can be selected by moving a cursor by means of a positioning element and/or by moving a mouse pointer at a graphic position of a corresponding one of the functional blocks. At the position of the corresponding one of the functional blocks, a function of the one of the functional units allocated to the corresponding one of the functional blocks can directly be selected and communicated to the control unit 28 to specify the function of the corresponding one of the functional units.

According to example embodiments of the invention, shortening links are inserted, which directly link to a specific configuration setting.

Such shortening links directly link to preferred parameter settings, status settings, numerical parameter settings and/or configurations of the functional blocks. Those shortening links are interchangeable which means they can be added, deleted and replaced by other shortening links which may be more preferred, as shown in the actual view of the display 29. This interchangeability can be user-defined and/or preconfigured and/or loaded with a setting. As a conclusion functions of a functional unit are directly selectable and/or configurable on the visual display device 29 through the shortening links of the configuration settings, which advantageously is time-saving and user-convenient.

Current configurations can be identified in the functional blocks, particularly important parameters being displayed directly in the functional blocks.

As a way of example, the first base band unit 102a in FIG. 2 obtains a shortening link to adjust the base bands frequency offset settings 240a. By touching this shortening link the frequency offset $\Delta f$ can be adjusted directly and without scrolling and searching a huge submenu bar of the corresponding base band unit menu.

By way of example, a shortening link may be a direct link to a concrete setting of each of the functional blocks. It is a so called shorted link to the preferred setting.

Such preferred parameters and settings are e.g. a numerical parameter of the functional block, a change of interconnection between the functional block and so on.

By way of example, shortening links according to the functional blocks of FIG. 2 are the base band settings of each base band unit 102a, 102b, the configuration of the adding unit 112a and 112b, the change of interconnections between each functional block, the activation/deactivation of noise in the noise block 115a, 115b, as well as static display information which are underlined, such as the working frequency, here 1.0 GHz, or the gain, here −30.0 dBm. Some of those shortening links are referenced as reference sign 300 in FIG. 2.

The shortening link is displayed as an extra part in the visual display 29 and/or shown as an underlined functional block.

FIG. 2 shows a cursor in finger form that is placed on a shortening link 240a to the offset frequency $\Delta f$ of the first base band unit 102a.

Figure 3:
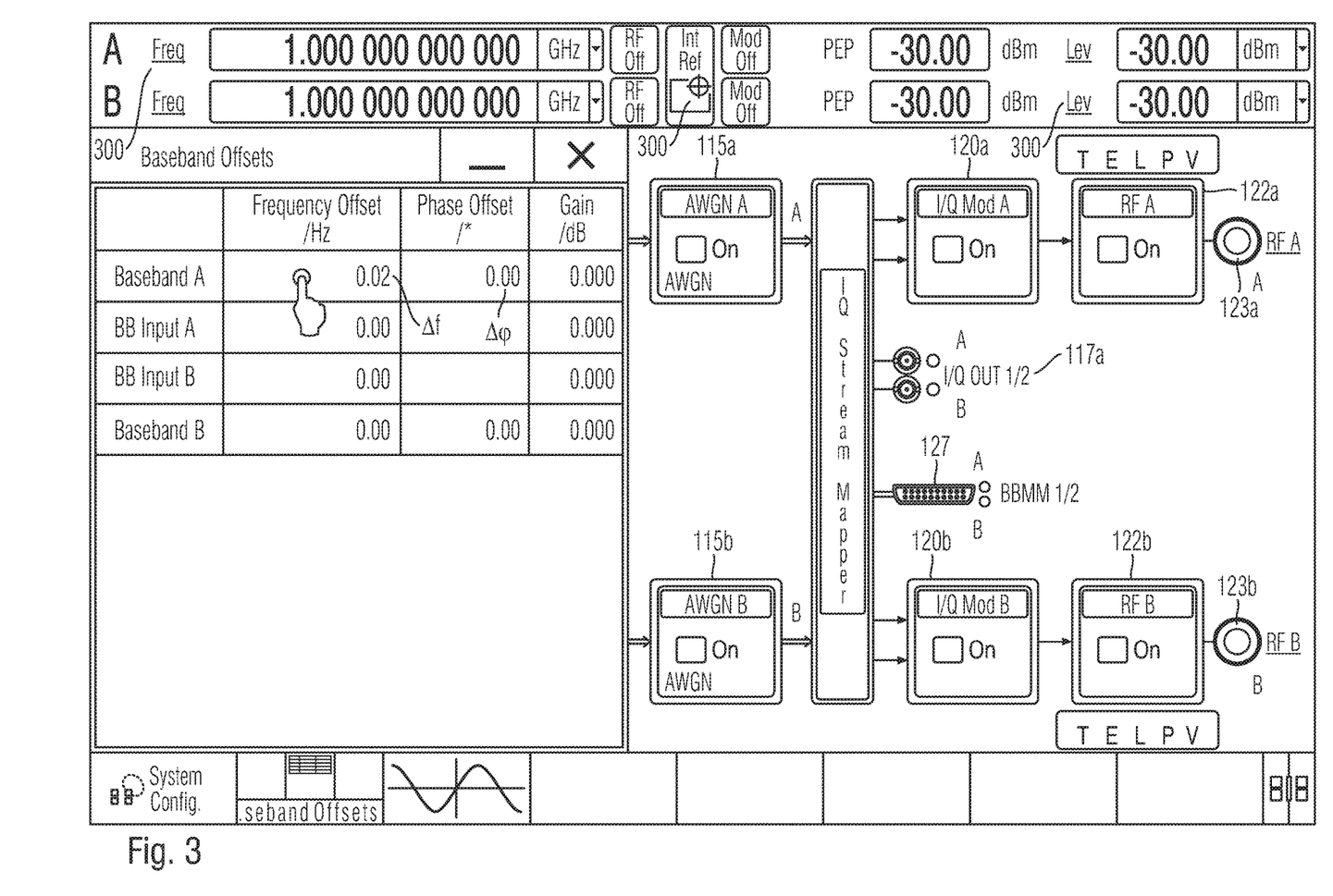
FIG. 3 shows a second example of a graphic display symbolizing the shortening links, according to example embodiments of the present invention.

FIG. 3 shows a second example of a graphic display surface of the display device 29, symbolizing shortening links, according to example embodiments of the present invention. In FIG. 3 the direct link to a submenu for displaying the actual status of the offset frequency $\Delta f$, the phase offset $\Delta \phi$ and the gain of the first base band unit 102a, the second base band unit 102b, the first digital input 107a and the second digital input 107b is shown. This submenu directly occurs after touching the shortening link 240a or moving a cursor to it and is useful to inform the user about preferred settings according to the base band unit 102a.

Figure 4:
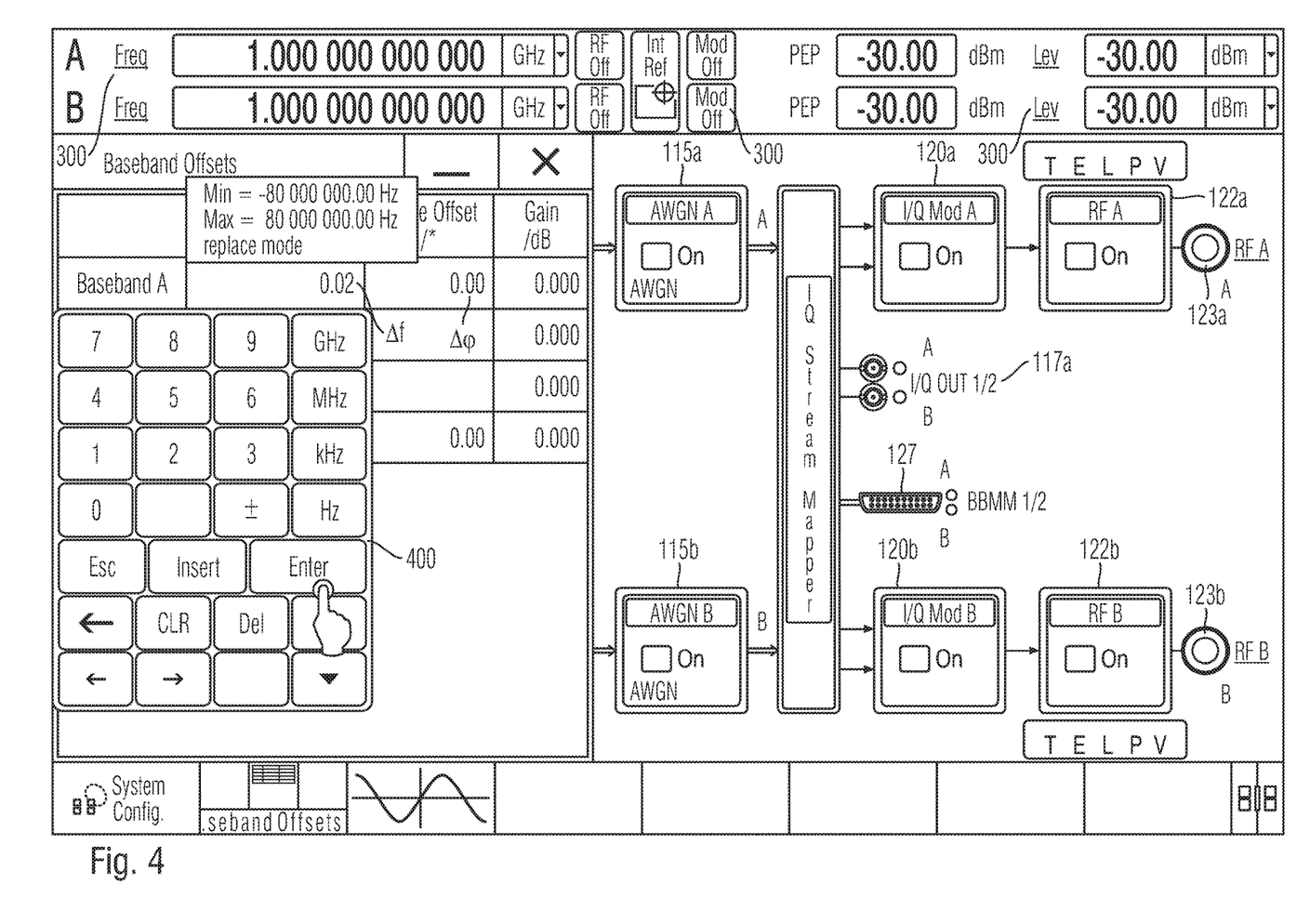
FIG. 4 shows a third example of a graphic display symbolizing the shortening links, according to example embodiments of the present invention.

FIG. 4 shows a third example of a graphic surface of the display device 29, symbolizing shortening links, according to example embodiments of the present invention. In FIG. 4 the direct link to a submenu for inserting, changing and/or adjusting the offset frequency $\Delta f$, the phase offset $\Delta \phi$ and/or the gain of the first base band unit 102a, the second base band unit 102b, the first digital input 107a and/or the second digital input 107b is shown. To insert, change and/or adjust the selected parameter, a numerical pad 400 is displayed. This numerical pad 400 is displayed on the display device 29. The selected parameter can be amended, adjusted, inserted or changed by moving a cursor by means of a positioning element and/or by moving a mouse pointer and/or by touching the visual display device 29 at a graphic position. The numerical pad 400 directly occurs after touching the display device 29 at the position where the selected parameter is displayed.

Figure 5:
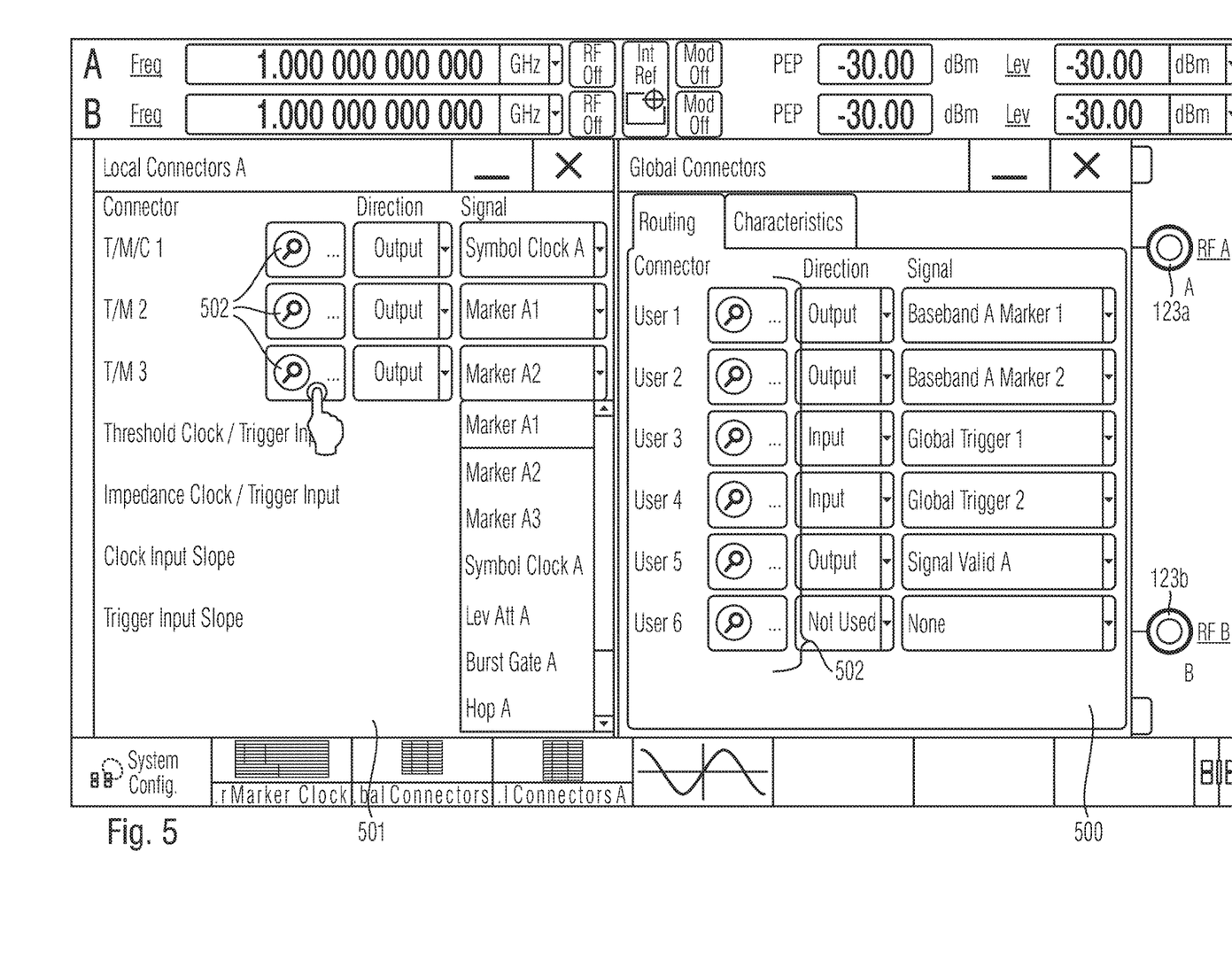
FIG. 5 shows a first example of a graphic display symbolizing the configuration of a connector, according to example embodiments of the present invention.

FIG. 5 shows a first example of a graphic display device 29 symbolizing the configuration of a connector, according to example embodiments of the present invention. The graphical representations of connectors 105a, 107a, 117a, 123a, 127, 105b, 107b, 117b, and 123b according to FIG. 2 are highly configurable and adjustable. One of these configuration settings is especially the selection of direction of the signal path. Each of these connectors can be set as an input or as an output connector. Additionally these settings comprise the selection of a termination resistance and/or the allocation/routing of specific signals to the specific connector.

As can be derived from FIG. 5, a submenu occurs that lists all available connectors, see submenu 501, wherein the first row of the submenu 501 provides the connector 102a which is configurable as input or output with an appropriate selection of the direction-setting. Furthermore connector 102a is routed with signal clock A.

According to the third row of the submenu 501, all routable signals for routing to connector T/M3 are listed, which for instance are marker signals to route internal signals of the measuring device 1 to a specific connector.

Figure 6:
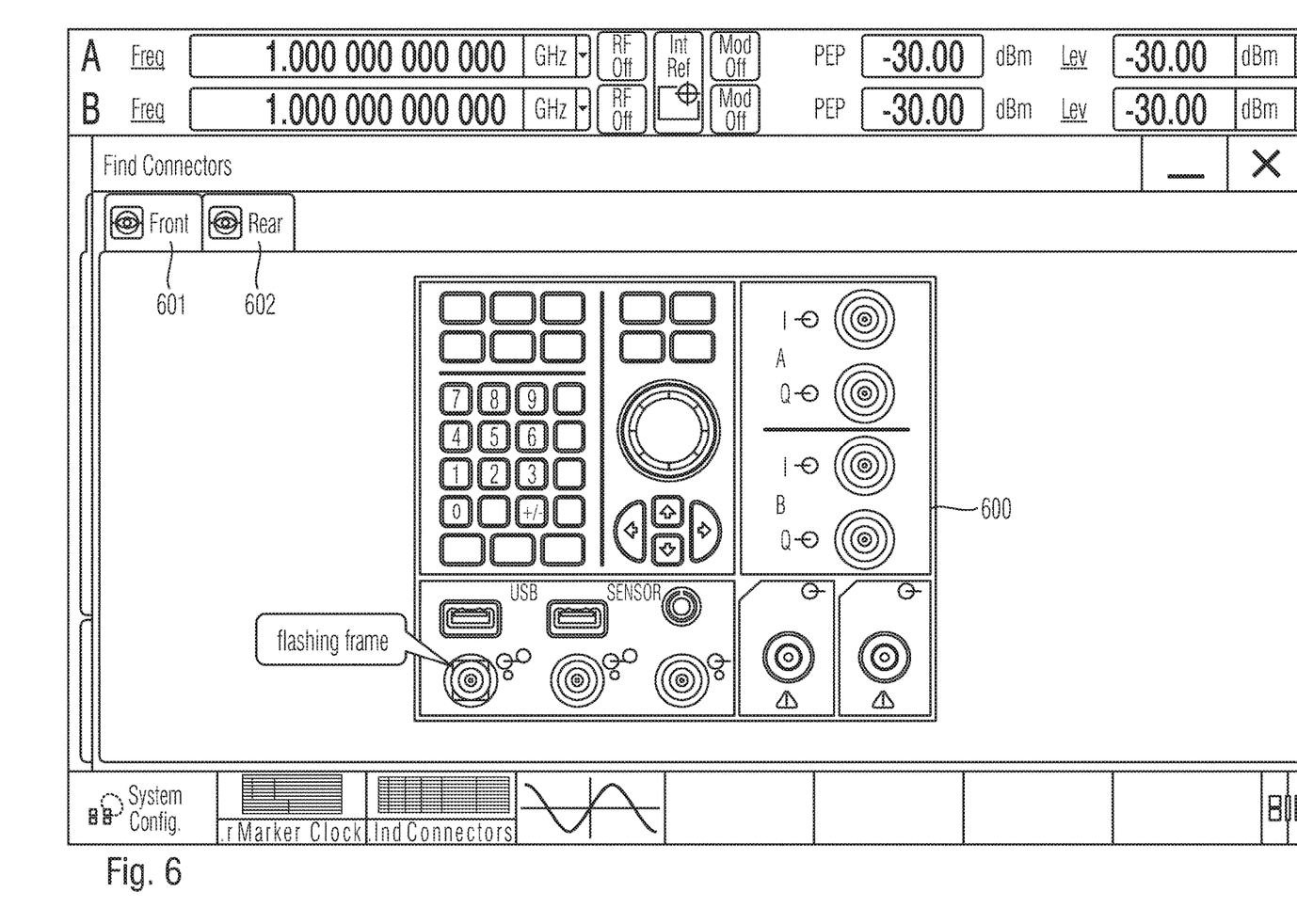
FIG. 6 shows a first example of a graphic display symbolizing the indication of a selected connector, according to example embodiments of the present invention.
Figure 7:
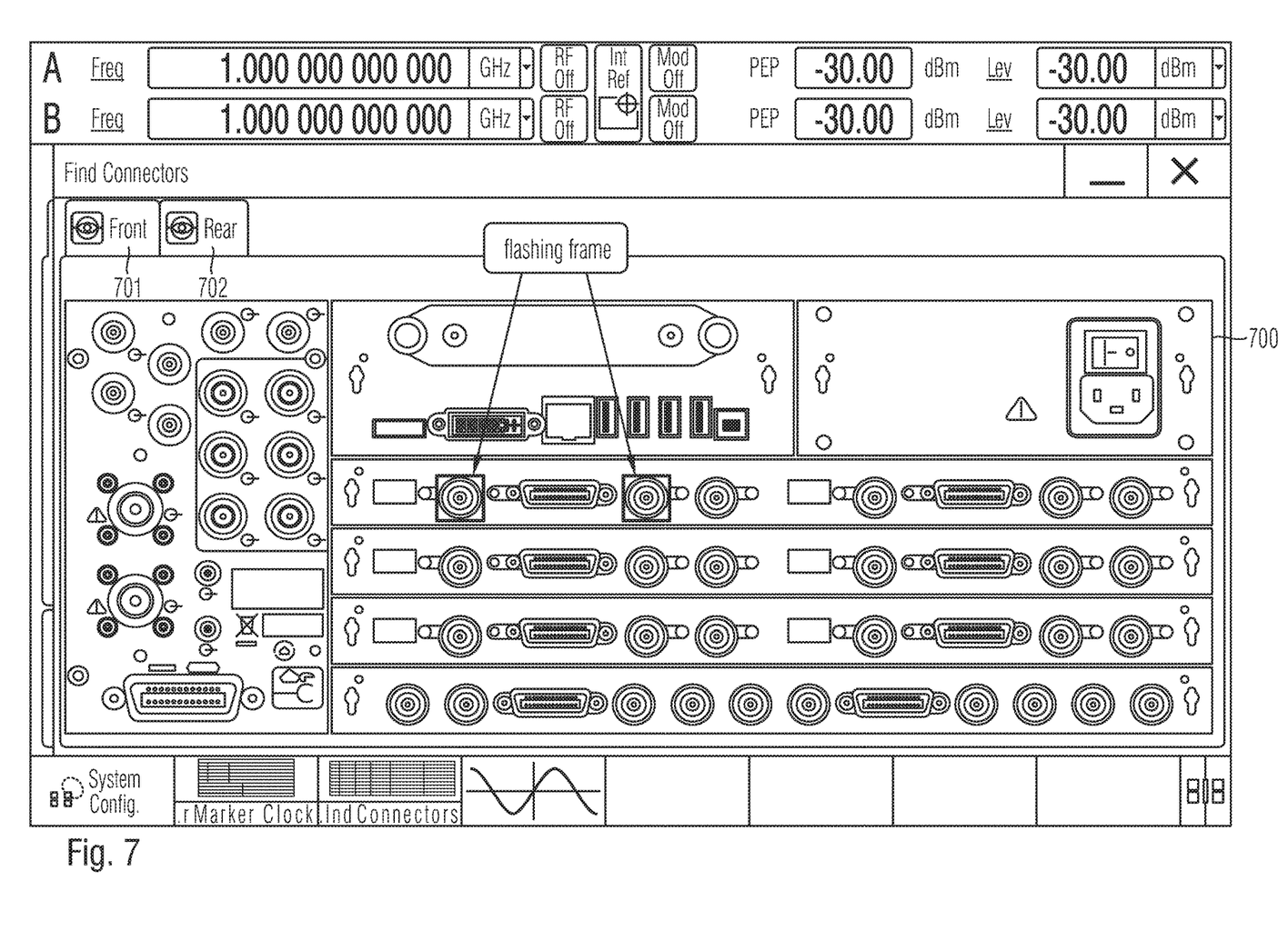
FIG. 7 shows a second example of a graphic display symbolizing the indication of a selected connector, according to example embodiments of the present invention.

According to example embodiments a shortening link 502 is provided which directly links to a panel image of the measuring device (see e.g., FIGS. 6 and 7). After touching the appropriate shortening link 502, a panel image comprising the selected connector is shown. For identification of the correct connector, a drawn frame flashes around the appropriate connector in the panel image to allow a user-friendly finding of the connector at the correct panel side. Since a lot of connectors in the measuring device 1 are included which all are highly configurable, it is easy to confuse a user and as a consequence lead the user to wrongly connect equipment to the measuring device. In case of sensitive devices under test, a wrongly chosen connector of the measuring device 1 connected to the device under test might disturb the device under test if maybe signal strength, signal gain and/or signal direction are falsely configured.

FIG. 6 shows a first example of a graphic display symbolizing the indication of a selected connector, according to example embodiments of the present invention. According to FIG. 6 a front panel 600 of an exemplary measuring device 1 is illustrated.

FIG. 7 shows a second example of a graphic display symbolizing the indication of a selected connector, according to example embodiments of the present invention. According to FIG. 7 a rear panel 700 of an exemplary measuring device 1 is illustrated.

The panel images 600, 700 in FIGS. 6 and 7 are actual images of the measuring device also in case of an upgrading or downgrading of the device. During the boot-sequence of the measuring device 1, the measuring device 1 executes a power on self-test and indicates the functional racks and functional blocks which are inserted in the measuring device 1. According to the result of the test, the measuring device 1 selects an appropriate panel image and displays the selected panel image for identification of the selected connector. Using actual panel images avoids a confusion of the user in case functional racks of the measuring device 1 are shown in the panel image which are actual not inserted in the measuring device 1 due to a downgraded version of the measuring device 1.

In some configurations, a connector is chosen which is available on different panels of the measuring device 1. Therefore panel indicators 601, 602, 701, 702 are inserted in the display 29 to indicate, on which panel of the measuring device 1 the selected connector can be found and if the selected connector is available on a plurality of panels. In FIGS. 6 and 7 the selected connector is available either on the front panel 600 right below corner or on the rear panel 700, fourth rack from the bottom left BNC-Connectors.

To easily identify the correct connector, flashing frames are used to indicate the exact position of the selected connector. By way of example, the flashing frames may be drawn for instance in rectangle.

The display 29 may comprise a graphical user interface GUI, which may be operable as a touch display 29. This allows a user-friendly operation, since the functional blocks of the measuring device 1 are easily selectable and configurable.

Furthermore a method for controlling a measuring device having a plurality of functional units capable of being selectively connected to one another is obtained. The method comprises the steps of: Setting a configuration and functions of the functional units in response to user input; and displaying a plurality of functional blocks respectively symbolizing the functional units and graphically connected by means of connecting elements such that the functional blocks are graphically interconnected by the connecting elements in a manner that corresponds to a current configuration of the functional units, wherein specific configuration settings and/or specific functions of a functional unit are directly selectable and/or configurable on the visual display device through shortening links of the configuration setting.

By way of example, the shortening link directly links to a corresponding link in a settings menu of the corresponding functional block.

By way of further example, the shortening link directly links to an adjustable numerical parameter of a functional unit or to a selectable configuration setting and/or status settings of a functional unit providing multiple pre-settings.

Additionally a method for controlling a measuring device having a plurality of functional units capable of being selectively connected to one another is provided. The method comprises the method steps: Setting a configuration and functions of the functional units in response to user input; and displaying a plurality of functional blocks respectively symbolizing the functional units and graphically connected by means of connecting elements such that the functional blocks are graphically interconnected by the connecting elements in a manner that corresponds to a current configuration of the functional units, wherein panel images of the measuring device are displayed on the displaying device and wherein the visual display device indicates a selected connector.

The operation of the measuring device 1 is considerably simplified in the above manner. The shortening links as well as the indication of a selected connector can be read off either directly from the allocated functional blocks. By contrast with the previously conventional method of operation via soft keys or hard keys, operation is largely self-explanatory, and it is not necessary to consult a user manual. The technical features described, drawn and/or claimed herein can be combined with each other.

Although some embodiments of the present invention have been described, anyone of ordinary skill in the art to which the invention pertains should be able to understand that a very large number of permutations are possible without departing the spirit and scope of the present invention and its equivalents, which shall only be defined by the claims appended below.

The invention claimed is:

1. A measuring device comprising:
a plurality of functional units configured to be selectively connected to one another;
a controller configured to set one or more of a configuration setting and at least one function of the functional units; and
a display configured to display a plurality of functional blocks graphically connected by means of connecting elements;
wherein the controller is further configured to control the display to display the functional blocks graphically interconnected by the connecting elements in a manner that corresponds to a current configuration setting of the functional units,
wherein one or more of specific configuration settings and specific functions of a functional unit are one or more of directly selectable and directly configurable through respective shortening links displayed within the current configuration setting,
wherein the shortening links provide a graphical user interface assistance of the measuring device, and
wherein the respective shortening link for a one of the functional units is allocated to a corresponding link in a settings menu of the corresponding functional block, and directly links to one or more adjustable numerical parameters for the functional unit.

2. The measuring device according to claim 1,
wherein the functions of any one of the functional units can be selected by one or more of controlling a display cursor, controlling a mouse pointer, and touching the display at a graphic position of a corresponding one of the functional blocks, and wherein, at the position of the corresponding one of the functional blocks, a function of the respective functional unit allocated to the corresponding one of the functional blocks is directly selected and communicated to the control module to specify the function of the corresponding one of the functional units.

3. The measuring device according to claim 1, wherein at least one of the shortening links is interchangeable and are user-defined.

4. The measuring device according to claim 1, wherein the adjustable numerical parameter of the functional unit is directly adjustable through a numerical pad, wherein the numerical pad is displayed on the display and the parameter can be adjusted by one or more of controlling a display cursor, moving a mouse pointer, and touching the display module at a graphic position.

5. The measuring device according to claim 1, wherein at least one of the shortening links directly links to one or more of a selectable configuration setting and a status setting of a functional unit.

6. The measuring device according to claim 1, wherein at least one of the shortening links is displayed as an underline of the respective graphically displayed functional block.

7. A method for controlling a measuring device comprising:
setting one or more of a configuration setting and at least one function of functional units of the measuring device; and
displaying, on a display of the measuring device, a plurality of functional blocks, each symbolizing a respective one of the functional units, graphically connected by means of connecting elements in a manner that corresponds to a current configuration setting of the functional units, wherein one or more of specific configuration settings and specific functions of a functional unit are one or more of directly selectable and directly configurable through shortening links displayed within the current configuration setting;
wherein the shortening links provide a graphical user interface assistance of the measuring device,
wherein the respective shortening link for a one of the functional units is allocated to a corresponding link in a settings menu of the corresponding functional block, and directly links to one or more adjustable numerical parameters for the functional unit.

8. The method according to claim 7, wherein at least one of the shortening links directly links to one or more of a selectable configuration setting and a status setting of a functional unit providing multiple pre-settings.

9. A measuring device comprising:
a plurality of functional units configured to be selectively connected to one another;
a controller configured to set one or more of a configuration setting and functions of the functional units; and
a display configured to display a plurality of functional blocks graphically connected by means of connecting elements;
wherein the controller is further configured to control the display to display the functional blocks graphically interconnected by the connecting elements in a manner that corresponds to a current configuration setting of the functional units,
wherein one or more of specific configuration settings and specific functions of a functional unit are one or more of directly selectable and directly configurable through respective shortening links displayed within the current configuration setting,
wherein the shortening links provide a graphical user interface assistance of the measuring device,
wherein the respective shortening link for a one of the functional units is allocated to a corresponding link in a settings menu of the corresponding functional block, and directly links to one or more adjustable numerical parameters for the functional unit,
wherein the display is further configured to display panel images of the measuring device indicating a selected connector, and
wherein the indication of the selected connector is indicated by a flashing frame on the display.

10. The measuring device according to claim 9, wherein the panel image is a front panel image of the measuring device.

11. The measuring device according to claim 9, wherein the panel image is a rear panel image of the measuring device.

12. The measuring device according to claim 9, wherein the selected connector is one or more of a configurable input connector and a configurable output connector.

13. The measuring device according to claim 9, wherein the panel image is a part of a graphical user interface assistance of the measuring device.

14. A method for controlling a measuring device comprising:
setting one or more of a configuration setting and functions of functional units of the measuring device; and
displaying a plurality of functional blocks, each symbolizing a respective one of the functional units, graphically interconnected by means of connecting elements in a manner that corresponds to a current configuration setting of the functional units;
wherein one or more of specific configuration settings and specific functions of a functional unit are one or more of directly selectable and directly configurable through respective shortening links displayed within the current configuration setting,
wherein the shortening links provide a graphical user interface assistance of the measuring device,
wherein the respective shortening link for a one of the functional units is allocated to a corresponding link in a settings menu of the corresponding functional block, and directly links to one or more adjustable numerical parameters for the functional unit,
wherein panel images of the measuring device are displayed on a display indicating a selected connector; and
wherein the indication of the selected connector is indicated by a flashing frame on the display.

* * * * *